(12) United States Patent
Imai

(10) Patent No.: US 7,453,915 B2
(45) Date of Patent: *Nov. 18, 2008

(54) OPTICAL SEMICONDUCTOR ELEMENT AND METHOD FOR MANUFACTURING THE SAME

(75) Inventor: Yasutaka Imai, Chino (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/566,850

(22) Filed: Dec. 5, 2006

(65) Prior Publication Data

US 2007/0133637 A1 Jun. 14, 2007

(30) Foreign Application Priority Data

Dec. 8, 2005 (JP) ............................. 2005-354431

(51) Int. Cl.
*H01S 5/00* (2006.01)
(52) U.S. Cl. ............... 372/50.1; 372/43.01; 372/50.124
(58) Field of Classification Search ............... 372/50.1, 372/43.01
See application file for complete search history.

(56) References Cited

U.S. PATENT DOCUMENTS 6,977,424 B1 * 12/2005 Walker et al. ............... 257/432
2005/0271107 A1 * 12/2005 Murakami et al. ......... 372/50.1

FOREIGN PATENT DOCUMENTS

| JP | 2004-006548 | 1/2004 |
| JP | 2005-197513 | 7/2005 |
| JP | 2006-033106 | 2/2006 |
| JP | 2006-066846 | 3/2006 |

* cited by examiner

*Primary Examiner*—Dung T Nguyen
(74) *Attorney, Agent, or Firm*—Harness, Dickey & Pierce, P.L.C.

(57) ABSTRACT

An optical semiconductor element includes: a surface-emitting type semiconductor laser that emits laser light; and an electrostatic breakdown protection element that is provided on an optical path of the laser light emitted from the surface-emitting type semiconductor laser, absorbs a portion of the laser light, and protects the surface-emitting type semiconductor laser from electrostatic destruction.

13 Claims, 9 Drawing Sheets

OPTICAL SEMICONDUCTOR ELEMENT AND METHOD FOR MANUFACTURING THE SAME

The entire disclosure of Japanese Patent Application No. 2005-354431, filed Dec. 8, 2005 is expressly incorporated by reference herein.

BACKGROUND

1. Technical Field

The present invention relates to optical semiconductor elements that emit laser light and methods for manufacturing the same.

2. Related Art

A surface-emitting type semiconductor laser is a type of optical elements that emit laser light. The surface-emitting type semiconductor laser is provided with a resonator formed in a direction orthogonal to a surface of the substrate, and emits laser light from the substrate surface. Compared to conventional edge-emitting type semiconductor lasers that use parallel cleavage surfaces of a substrate as a resonator, the surface-emitting type semiconductor laser has various favorable characteristics. For example, surface-emitting type semiconductor lasers are suitable for mass-production, capable of direct modulation, capable of operation with low threshold levels, capable of oscillation in a single longitudinal mode, and a two-dimensional laser array structure can be readily formed with surface-emitting type semiconductor lasers.

A surface-emitting type semiconductor laser has a smaller device volume compared to an ordinary edge-emitting type semiconductor laser, such that the electrostatic breakdown voltage of the device itself is low. When the electrostatic breakdown voltage is low, the device may be damaged by static electricity caused by a machine or an operator while the device is mounted on a substrate or a pedestal. For this reason, a variety of measures are implemented in a device mounting process to remove static electricity. To remove static electricity from operators, for example, the operators wear working dresses made of antistatic fabric during work, humidity of the work environment is controlled, and the work environment is always placed in an electrically neutralized state by using ionizers. However, these measures have limitations, and the possibility of destruction of devices having an electrostatic breakdown voltage of about 200V or lower during mounting process becomes higher. In this respect, for example, Japanese Laid-open Patent Application JP-A-2004-6548 describes a semiconductor laser with an improved electrostatic breakdown voltage.

Furthermore, surface-emitting type semiconductor lasers have characteristics in which their optical output changes according to the ambient temperature. In this respect, Japanese Laid-open Patent Applications JP-A-2005-33106 and JP-A2005-197513 describe semiconductor elements in which a light-receiving element such as a photodiode is provided on a surface-emitting type semiconductor laser, a portion of laser light emitted from the surface-emitting type semiconductor laser is detected for monitoring by the photo-detecting element, and outputs of the surface-emitting type semiconductor laser are controlled based on the monitored results.

It is noted that surface-emitting type semiconductor lasers have breakdown voltage characteristics in which their breakdown voltage is relatively high against a forward bias, which is about 500V or higher, but relatively low against a reverse bias, which is 300 V or lower. For this reason, it is effective to implement measures against reverse bias for improving the electrostatic breakdown voltage of surface-emitting type semiconductor lasers. For example, according to one of such measures, a surface-emitting type semiconductor laser may be provided with a diode having inverse characteristics, which is connected in parallel with the surface-emitting type semiconductor laser as an electrostatic breakdown element. However, if the electrostatic breakdown element is provided within a single chip separately from the surface-emitting type semiconductor laser, the design margin becomes small, which makes it difficult to design photo masks that are to be used for manufacturing the optical semiconductor element.

Moreover, surface-emitting type semiconductor lasers include an eye-safe measure to secure the safety of the person's retinas. More concretely, when an optical sub-assembly (OSA) such as a transmitter optical sub-assembly (TOSA) is equipped with a surface-emitting type semiconductor laser, a reflection film may be formed at a laser light emission window provided on the TOSA as a measure to adjust the transmittivity of laser light to thereby prevent emission of excessive laser light. However, if the laser light emitted from the surface-emitting type semiconductor laser is reflected by the reflection film and enters the surface-emitting type semiconductor laser, noise could be generated.

SUMMARY

In accordance with an advantage of some aspects of the present invention, there are provided optical semiconductor elements and methods for manufacturing the same in which electrostatic breakdown voltages of surface-emitting type semiconductor lasers can be improved, device miniaturization can be readily realized, and laser light outputs can be readily adjusted.

In accordance with an embodiment of the invention, an optical semiconductor element is equipped with a surface-emitting type semiconductor laser that emits laser light, and an electrostatic breakdown protection element that is provided on an optical path of the laser light emitted from the surface-emitting type semiconductor laser, absorbs a portion of the laser light, and protects the surface-emitting type semiconductor laser from electrostatic destruction.

In accordance with the embodiment described above, the electrostatic breakdown protection element is provided on the optical path of laser light emitted from the surface-emitting type semiconductor laser, wherein the electrostatic breakdown protection element absorbs a portion of the laser light, and protects the surface-emitting type semiconductor laser from electrostatic destruction. As a result, the electrostatic breakdown voltage of the surface-emitting type semiconductor laser can be improved, and the output of laser light can be readily adjusted.

In the optical semiconductor element in accordance with an aspect of the embodiment of the invention, the surface-emitting type semiconductor laser is provided on a substrate, and the electrostatic breakdown protection element is provided above the surface-emitting type semiconductor laser.

In accordance with the embodiment described above, the optical semiconductor element has a structure in which the electrostatic breakdown prevention element is provided above the surface-emitting type semiconductor laser. Therefore, even when the electrostatic breakdown prevention element and the surface-emitting type semiconductor laser are provided in a single chip, the design margin would not become narrower, and miniaturization can be readily achieved.

Also, in the optical semiconductor element in accordance with an aspect of the embodiment of the invention, an isolation layer may preferably be provided between the surface-emitting type semiconductor laser and the electrostatic breakdown protection element for isolating the surface-emitting type semiconductor laser from the electrostatic breakdown protection element.

The optical semiconductor element in accordance with an aspect of the embodiment of the invention may be equipped with a first electrode and a second electrode for driving the surface-emitting type semiconductor laser, wherein the electrostatic breakdown protection element may be electrically connected between the first electrode and the second electrode in parallel with the surface-emitting type semiconductor laser, and may have a rectification action in a reverse direction with respect to the surface-emitting type semiconductor laser.

According to the present embodiment, the electrostatic breakdown protection element having a rectification action in a reverse direction with respect to the surface-emitting type semiconductor laser is electrically connected in parallel with the surface-emitting type semiconductor laser between the first electrode and the second electrode for driving the surface-emitting type semiconductor laser. For this reason, even when a reverse bias voltage is applied to the surface-emitting type semiconductor laser, the current flows through the electrostatic breakdown protection element, such that the electrostatic breakdown voltage against reverse bias voltage can be substantially improved.

Also, the optical semiconductor element in accordance with an aspect of the embodiment of the invention may be equipped with a first electrode of a first polarity and a second electrode of a second polarity different from the first polarity that are formed on the surface-emitting type semiconductor laser, a third electrode of the first polarity and a fourth electrode of the second polarity that are formed on the electrostatic breakdown protection element, and a connection wiring formed on the second electrode and the third electrode for connecting the second electrode and the third electrode.

The optical semiconductor element in accordance with an aspect of the embodiment of the invention may be equipped with a connection wiring formed on the first electrode and the fourth electrode for connecting the first electrode and the fourth electrode.

Alternatively, the optical semiconductor element in accordance with an aspect of the embodiment of the invention may be equipped with a metal wire connected to each of the first electrode and the fourth electrode for electrically connecting the first electrode and the fourth electrode.

According to the embodiment described above, the second electrode having the second polarity formed on the surface-emitting type semiconductor laser and the third electrode having the first polarity formed on the electrostatic breakdown protection element are electrically connected to each other by an electrode wiring formed on the aforementioned electrodes. Also, the first electrode having the first polarity formed on the surface-emitting type semiconductor laser and the fourth electrode having the second polarity formed on the electrostatic breakdown protection element are electrically connected to each other by an electrode wiring formed on the aforementioned electrodes or a metal wire connected to the aforementioned electrodes. For this reason, the electrostatic breakdown protection element can be readily connected to the surface-emitting type semiconductor laser in a manner to have a reverse rectification with respect to the surface-emitting type semiconductor laser.

Furthermore, in the optical semiconductor element in accordance with an aspect of the embodiment of the invention, the electrostatic breakdown protection element may be an element formed with a PN junction, a PIN junction, a hetero junction, or a Schottky junction.

In the optical semiconductor element in accordance with an aspect of the embodiment of the invention, when the electrostatic breakdown protection element is formed with a PN junction, a PIN junction or a hetero junction, the electrostatic breakdown protection element may preferably be equipped with a first semiconductor layer of a first conductivity type, a second semiconductor layer that functions as an absorption layer and an electrostatic breakdown protection layer, and a third semiconductor layer of a second conductivity type, and a total optical film thickness of the electrostatic breakdown protection element may preferably be a film thickness other than a film thickness that establishes a resonance condition of the laser light within the electrostatic breakdown protection element.

According to the embodiment described above, the total optical film thickness of the electrostatic breakdown protection element is set to a film thickness other than a film thickness that establishes a resonance condition of the laser light within the electrostatic breakdown protection element, such that an elevation of the oscillation threshold of the surface-emitting type semiconductor laser which may be caused by a lowered reflection coefficient of the electrostatic breakdown protection element can be prevented, and incidence of external light on the surface-emitting type semiconductor laser which may be caused by an elevation of the transmittivity of the electrostatic breakdown protection element can be prevented. However, a portion of laser light emitted from the surface-emitting type semiconductor laser is absorbed by the electrostatic breakdown protection element, such that the output of laser light can be readily adjusted.

Furthermore, in the optical semiconductor element in accordance with an aspect of the embodiment of the invention, the total optical film thickness of the electrostatic breakdown protection element may preferably be equal to an odd multiple of one fourth of a wavelength of the laser light in the electrostatic breakdown protection element.

The electrostatic breakdown protection element having a total optical film thickness that is equal to an odd multiple of one fourth of a wavelength of the laser light is suitable for preventing a substantial reduction in the reflection coefficient and a substantial elevation in the transmittivity of the electrostatic breakdown protection element.

A method for manufacturing an optical semiconductor element in accordance with another embodiment of the invention pertains to a method for manufacturing an optical semiconductor element having a surface-emitting type semiconductor laser that emits laser light, wherein the method includes the steps of: forming a first semiconductor multilayer film defining the surface-emitting type semiconductor laser on a substrate; forming, above the first semiconductor multilayer film, a second semiconductor multilayer film defining an electrostatic breakdown protection element that absorbs a portion of the laser light emitted from the surface-emitting type semiconductor laser, and protects the surface-emitting type semiconductor laser from electrostatic destruction; forming the electrostatic breakdown protection element by etching the second semiconductor multilayer film; forming the surface-emitting type semiconductor laser below the electrostatic breakdown protection element by etching the first semiconductor multilayer film; forming a first electrode of a first polarity and a second electrode of a second polarity different from the first polarity on the surface-emitting type semiconductor laser; forming a third electrode of the first polarity and a fourth electrode of the second polarity on the electrostatic breakdown protection element; and forming a connection wiring on the second electrode and the third electrode for connecting the second electrode and the third electrode.

According to the embodiment described above, the first semiconductor multilayer film defining a surface-emitting type semiconductor laser and the second semiconductor multilayer film defining an electrostatic breakdown protection element are sequentially formed on the substrate, and then the second semiconductor multilayer film is etched whereby the electrostatic breakdown protection element is formed, and then the first semiconductor multilayer film is etched whereby the surface-emitting type semiconductor laser is formed below the electrostatic breakdown protection element. Then, the first electrode having a first polarity and the second electrode having a second polarity are formed on the surface-emitting type semiconductor laser, the third electrode having the first polarity and the fourth electrode having the second polarity are formed on the electrostatic breakdown protection element, and the connection wiring is formed on the second electrode and the third electrode for connecting the second electrode and the third electrode.

According to the embodiment described above, because the electrostatic breakdown protection element is formed above the surface-emitting type semiconductor laser, the design margin would not become narrow even when they are provided in a single chip, such that the optical semiconductor element can be readily miniaturized.

The method for manufacturing an optical semiconductor element in accordance with an aspect of the embodiment of the invention may include the step of forming a connection wiring on the first electrode and the fourth electrode for connecting the first electrode and the fourth electrode.

Alternatively, the method for manufacturing an optical semiconductor element in accordance with an aspect of the embodiment of the invention may include the step of forming a metal wire on the first electrode and the fourth electrode for electrically connecting the first electrode and the fourth electrode to each other.

According to the embodiment described above, the connection wiring may be formed on the first electrode and the fourth electrode for connecting the first electrode and the fourth electrode, or the metal wire is connected to the first electrode and the fourth electrode for electrically connecting the first electrode and the fourth electrode to each other. As a result, the electrostatic breakdown protection element can be readily connected to the surface-emitting type semiconductor laser in a manner to have a reverse rectification with respect to the surface-emitting type semiconductor laser.

DESCRIPTION OF EXEMPLARY EMBODIMENTS

Figure 1:
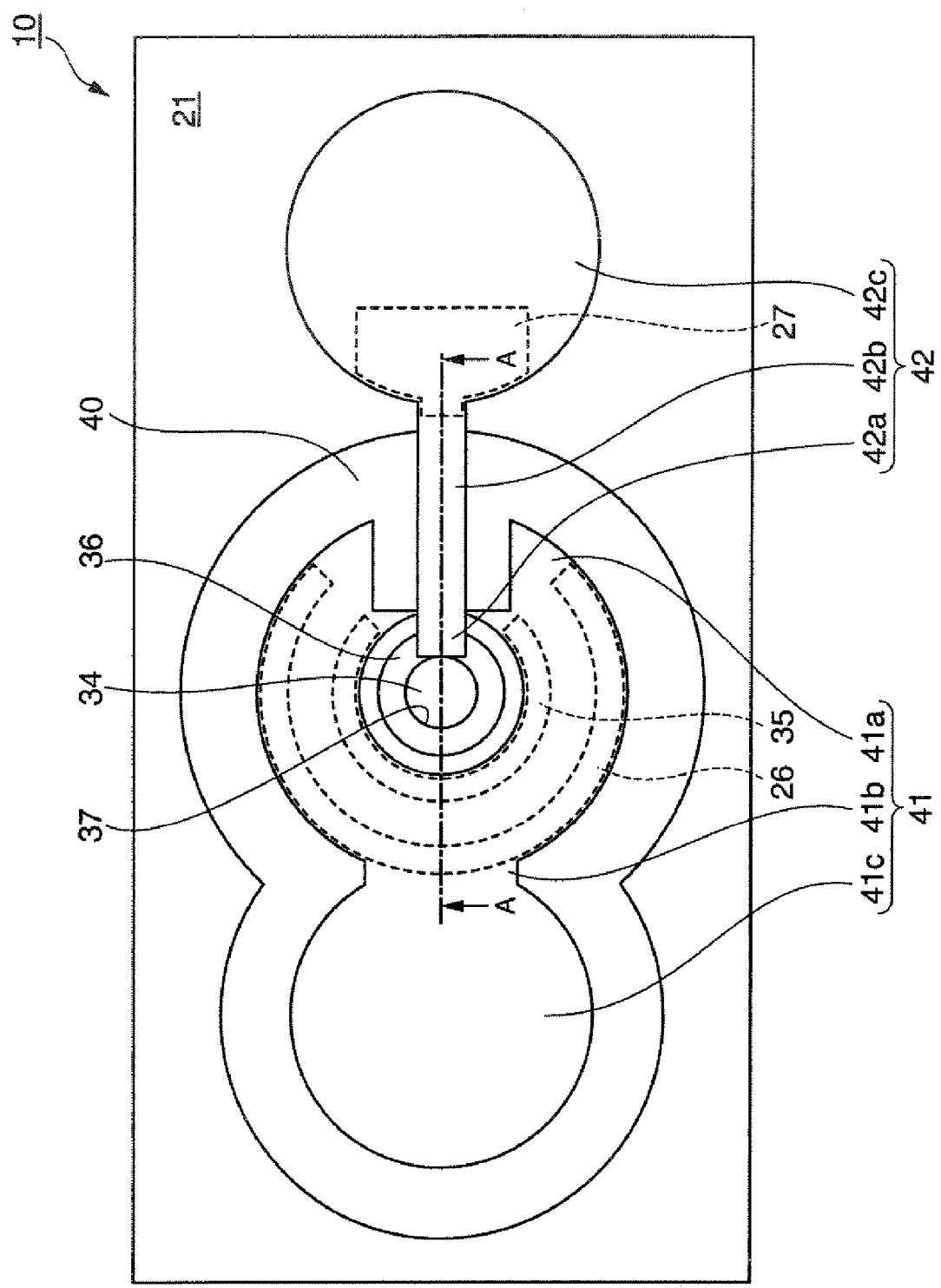
FIG. 1 is a plan view schematically showing an optical semiconductor element in accordance with a first embodiment of the invention.

Optical semiconductor elements and methods for manufacturing the same in accordance with preferred embodiments of the invention are described below with reference to the accompanying drawings The embodiments described below show a part of embodiments of the invention, and do not limit the invention, and changes can be optionally made within the scope of the invention Also, in the drawings referred to below for describing the invention, the scale may be changed for each of the layers and each of the members such that the layers and the members can have appropriate sizes that can be recognized on the drawings.

First Embodiment

Figure 2:
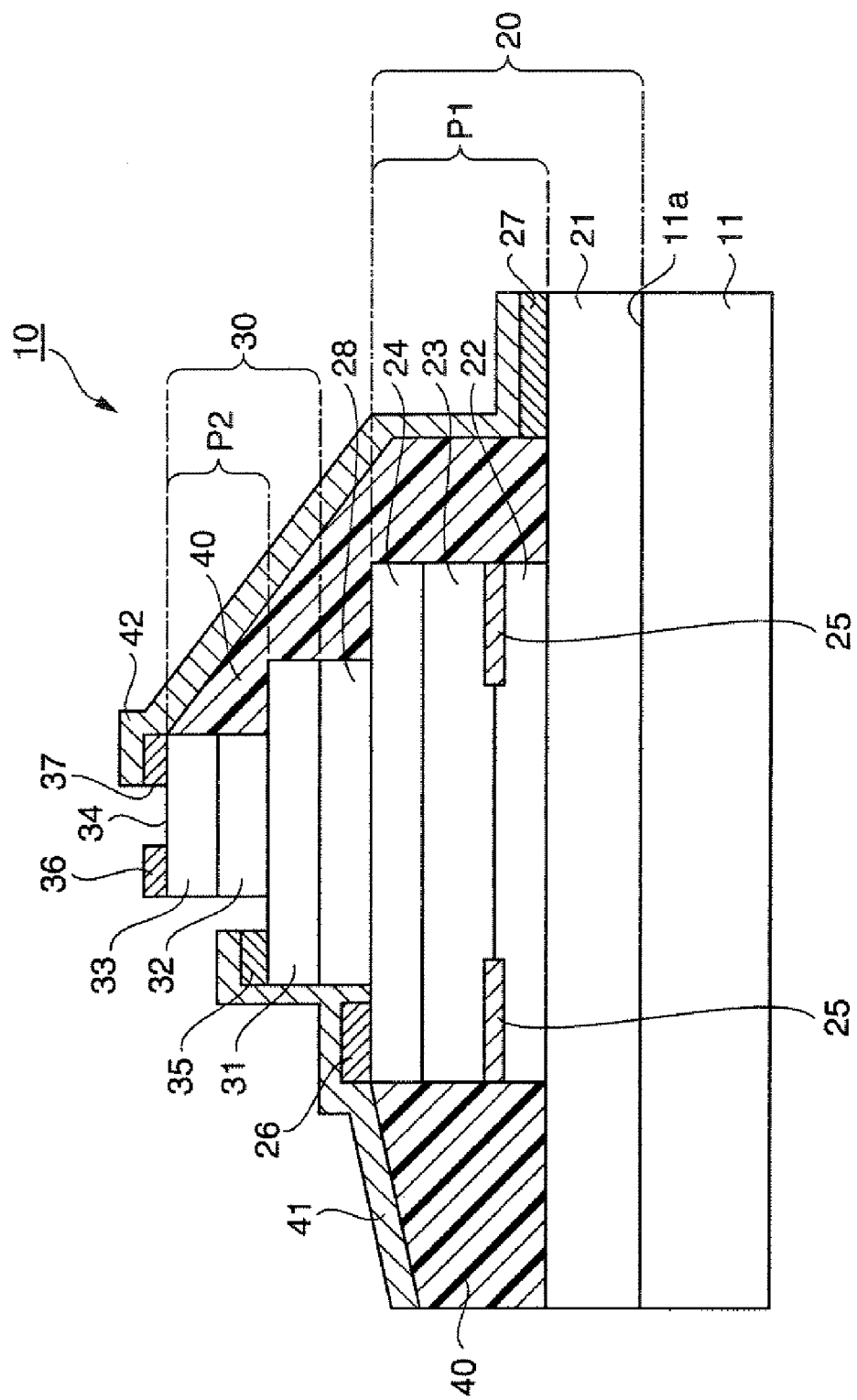
FIG. 2 is a cross-sectional view taken along a line A-A of FIG. 1.

FIG. 1 schematically shows a plan view of an optical semiconductor element 10 in accordance with a first embodiment of the invention, and FIG. 2 is a cross-sectional view taken along a line A-A of FIG. 1. As shown in FIG. 2, the optical semiconductor element 10 of the present embodiment includes a surface-emitting type semiconductor laser 20 and an electrostatic breakdown protection element 30. Each of the elements and the entire structure are described below.

Surface-emitting Type Semiconductor Laser

The surface-emitting type semiconductor laser 20 is formed on a semiconductor substrate (for example, an n-type GaAs substrate in the present embodiment) 11. The surface-emitting type semiconductor laser 20 has a vertical resonator, wherein, in the present embodiment, one of distributed Bragg reflector that compose the vertical resonator is formed in a semiconductor deposited body (hereafter referred to as a first columnar section) P1. In other words, the surface-emitting type semiconductor laser 20 has a portion included in the first columnar section P1.

The surface-emitting type semiconductor laser 20 has a multilayered structure in which a distributed Bragg reflector (hereafter referred to as a first mirror) 21 composed of for example, 40 pairs of alternately laminated n-type $Al_{0.9}Ga_{0.1}As$ layers and n-type $Al_{0.15}Ga_{0.85}As$ layers, an active layer 22 composed of GaAs well layers and $Al_{0.3}Ga_{0.7}As$ barrier layers in which the well layers include a quantum well structure composed of three layers, a distributed Bragg reflector (hereafter referred to as a second mirror) 23 composed of, for example, 25 pairs of alternately laminated p-type $Al_{0.9}Ga_{0.1}As$ layers and p-type $Al_{0.15}Ga_{0.85}As$ layers, and a contact layer 24 composed of p-type GaAs are sequentially laminated.

In the present embodiment, the Al composition of an AlGaAs layer is a composition of aluminum (Al) with respect to gallium (Ga). The Al composition of an AlGaAs layer may range from "0" to "1." In other words, an AlGaAs layer may include a GaAs layer (with the Al composition being "0") and an AlAs layer (with the Al composition being "1"). It is noted that the composition of each of the layers and the number of the layers forming the first mirror 21, the active layer 22, the second mirror 23 and the contact layer 24 are not particularly limited to the above.

The first mirror 21 composing the surface-emitting type semiconductor laser 20 is formed to be n-type by, for example, doping silicon (Si), and the second mirror 23 is formed to be p-type by, for example, doping carbon (C). Accordingly, the p-type second mirror 23, the active layer 22 in which no impurity is doped, and the n-type first mirror 21 form a pin diode. Also, in accordance with the present embodiment, among the surface-emitting type semiconductor laser 20, the second mirror 23 and the contact layer 24 are etched in a circular shape as viewed in a plan view from above the second mirror 23, thereby forming the first columnar section P1. It is noted that the first columnar section P1 is given a plane configuration of a circular shape in this embodiment, but can be in any one of arbitrary shapes.

Further, a current constricting layer 25, which is obtained by oxidizing the AlGaAs layer from its side surface, is formed in a region near the active layer 22 among the layers composing the second mirror 23 The current constricting layer 25 is formed in a ring shape. In other words, the current constricting layer 25 has a cross section, when cut in a plane parallel with a surface 11a of the semiconductor substrate 11 shown in FIG. 1 and FIG. 2, which is a circular ring shape concentric with a circular shape of the plane configuration of the first columnar section P1.

An electrode 26 having a plane configuration in a ring shape is provided on the contact layer 24 along the outer circumference of the first columnar section P1. The electrode 26 is formed from a multilayer film of, for example, an alloy of chrome (Cr), gold (Au) and zinc (Zn), and gold (Au), or a multilayer film of, for example, platinum (Pt), titanium (Ti) and gold (Au). Also, an electrode 27 is formed on a portion of the top surface of the second mirror 21. The electrode 27 is formed from a multilayer film of, for example, an alloy of chrome (Cr), gold (Au) and germanium (Ge), nickel (Ni), and gold (Au). The electrodes 26 and 27 are provided for driving the surface-emitting type semiconductor laser 20, and a current is injected into the active layer 22 through the electrodes 26 and 27.

Isolation Layer

The optical semiconductor element 10 is also equipped with an isolation layer 28 formed on the surface-emitting type semiconductor laser 20. More specifically, the isolation layer 28 is provided between the surface-emitting type semiconductor laser 20 and an electrostatic breakdown protection element 30 to be described below. Concretely, as shown in FIG. 2, the isolation layer 28 is formed between the contact layer 24 of the surface-emitting type semiconductor laser 20 and a first contact layer 31 to be described below of the electrostatic breakdown protection element 30 to be described below. As described above, because the electrode 26 in a ring shape is formed on the top surface of the contact layer 24, the isolation layer 28, except a portion thereof, is surrounded by the electrode 26 (see FIG. 1).

The isolation layer 28 has a plane configuration that is a circular shape. In the illustrated example, the plane configuration of the isolation layer 28 is the same as the plane configuration of a first contact layer 31, and formed such that their diameter is smaller than the diameter of the first columnar section P1. It is noted that the plane configuration of the isolation layer 28 may be formed to be greater than the plane configuration of the first contact layer 31. Although FIG. 2 illustrates an exemplary case in which the isolation layer 28 is formed to be generally concentric with the first columnar section P1, the isolation layer 28 may be formed eccentric with respect to the first columnar section P1. The isolation layer 28 is described in greater detail below in conjunction with a method for manufacturing an optical semiconductor element to be described below.

Electrostatic Breakdown Protection Element

The electrostatic breakdown protection element 30 is formed on the isolation layer 28 and on an optical path of laser light emitted from the surface-emitting type semiconductor laser 20. The electrostatic breakdown protection element 30 is formed from a first contact layer 31, an electrostatic breakdown protection layer 32, and a second contact layer 33. The first contact layer 31 is provided on the isolation layer 28, the electrostatic breakdown protection layer 32 is provided on the first contact layer 31, and the second contact layer 33 is provided on the electrostatic breakdown protection layer 32. The electrostatic breakdown protection layer 32 and the second contact layer 33 are formed to have a plane configuration that is smaller than the plane configuration of the first contact layer 31. The second contact layer 33 and the electrostatic breakdown protection layer 32 composes a columnar semiconductor deposited body (hereafter referred to as a second columnar section) P2. In other words, the electrostatic breakdown protection element 30 has a structure with a part thereof being included in the second columnar section P2. It is noted that the top surface of the electrostatic breakdown protection element 30 defines an emission surface 34 for emitting laser light from the surface-emitting type semiconductor laser 20.

The first contact layer 31 composing the electrostatic breakdown protection element 30 is composed of an n-type GaAs layer, the electrostatic breakdown protection layer 32 is composed of a GaAs layer in which no impurity is doped, and the second contact layer 33 is composed of a p-type GaAs layer. More concretely, the first contact layer 31 is made to be n-type by doping, for example, silicon (Si), and the second contact layer 33 is made to be p-type by doping, for example, carbon (C). Accordingly, the n-type first contact layer 31, the electrostatic breakdown protection layer 32 in which no impurity is doped, and the p-type second contact layer 33 form a pin diode.

The electrostatic breakdown protection element 30 protects the surface-emitting type semiconductor laser 20 from electrostatic destruction, and absorbs a portion of laser light emitted from the surface-emitting type semiconductor laser 20 as an eye-safe measure The electrostatic breakdown protection element 30 has the electrostatic breakdown protection layer 32 provided therein that absorbs laser light emitted from the surface-emitting type semiconductor laser 20. From the viewpoint of absorption of laser light emitted from the surface-emitting type semiconductor laser 20, when the electrostatic breakdown protection element 30 is formed to have a film thickness that causes resonance (Fabry-Perot resonance), the amount of laser light absorption increases.

However, in a state in which the resonance condition is established, the reflection coefficient of the electrostatic breakdown protection element 30 becomes extremely small, For the surface-emitting type semiconductor laser 20, the electrostatic breakdown protection element 30 provides a function similar to a portion of the second mirror 23. Therefore, when the reflection coefficient of the electrostatic breakdown protection element 30 becomes smaller, the light confinement effect within the surface-emitting type semiconductor laser 20 becomes deteriorated which leads to an elevation in the oscillation threshold. When the oscillation threshold rises, power consumption increases and high-speed operation is suppressed. For this reason, a lower oscillation threshold of the surface-emitting type semiconductor laser 20 is desirable. Also, in a state in which the oscillation condition is established, the reflection coefficient of the electrostatic breakdown protection element 30 becomes smaller while its transmittivity becomes greater. As a result, external light may pass through the electrostatic breakdown protection element 30 and enter the surface-emitting type semiconductor laser 20, which may cause deteriorating influence such as noise.

It is noted that the resonance condition of the electrostatic breakdown protection element 30 is established when the optical film thickness of the entire electrostatic breakdown protection element 30 equals to a multiple of $\lambda/2$, where $\lambda$ is a wavelength of laser light in the electrostatic breakdown protection element 30. Therefore, the optical film thickness of the entire electrostatic breakdown protection element 30 may desirably be a film thickness other than a multiple of $\lambda/2$ at which the resonance condition is established. More specifically, the optical film thickness of the entire electrostatic breakdown protection element 30 may preferably be set at an odd multiple of $\lambda/4$. By providing such a film thickness, the reflection coefficient of the electrostatic breakdown protection element 30 does not substantially lower, such that an elevation of the oscillation threshold of the surface-emitting type semiconductor laser 20 is not caused. Also, because the transmittivity of the electrostatic breakdown protection element 30 does not substantially increase, external light can be prevented from entering the surface-emitting type semiconductor laser 20, whereby generation of noise can be prevented.

An electrode 35 having a ring-shaped plane configuration is formed on the first contact layer 31 along an outer circumference thereof. In other words, the electrode 35 is provided in a manner to surround the second columnar section P2 except a portion thereof. The electrode 35 may be formed from the same material as that of the electrode 27 formed on the first mirror 21 of the surface-emitting type semiconductor laser 20. More specifically, for example, the electrode 35 may be formed from a multilayer film of an alloy of chrome (Cr), gold (Au) and germanium (Ge), nickel (Ni) and gold (Au).

Also, an electrode 36 is formed on the top surface of the electrostatic breakdown protection element 30 (on the second contact layer 33). The electrode 36 defines an opening section 37, and a portion of the top surface of the second contact layer 33 is exposed through the opening section 37. The exposed surface defines an emission surface 34 for emitting laser light. Accordingly, by appropriately setting the plane configuration and the size of the opening section 37, the configuration and the size of the emission surface 34 can be appropriately set. In the present embodiment, the emission surface 34 may be circular, as shown in FIG. 1. Also, the electrode 36 may be formed from the same material as that of the electrode 26 formed on the contact layer 24 of the surface-emitting type semiconductor laser 20.

Insulation Layer

The optical semiconductor element 10 in accordance with the present embodiment is provided with an insulation layer 40 formed mainly around the circumference of the first columnar section P1 on the first mirror 21, as shown in FIG. 1 and FIG. 2. Also, the insulation layer 40 covers a portion of the top surface of the first columnar section P1, a portion of the side surface of the isolation layer 28, a portion of the side surface and the top surface of the first contact layer 31, and a portion of the side surface of the second columnar section P2. Also, the insulation layer 40 is formed below electrode wirings 41 and 42 to be described below and around the electrode wiring 41.

Electrode Wiring

An electrode wiring 41 electrically connects the electrode 26 of the surface-emitting type semiconductor laser 20 and the electrode 35 of the electrostatic breakdown protection element 30. As shown in FIG. 1, the electrode wiring 41 has a connection section 41a having a ring-shaped plane configuration, a wiring section 41b, and a pad section 41c having a circular plane configuration. The electrode wiring 41 is electrically connected to the top surfaces of the electrodes 26 and 35 at the connection section 41a. The wiring section 41b of the electrode wiring 41 connects the connection section 41a and the pad section 41c. The pad section 41c of the electrode wiring 41 is used as an electrode pad.

An electrode wiring 42 connects the electrode 27 that is formed in a part of the top surface of the first mirror 21 with the electrode 36 of the electrostatic breakdown protection element 30. The electrode wiring 42 has, as shown in FIG. 1, a connection section 42a having a rectangular plane configuration, a wiring section 42b having a rectangular plane configuration, and a pad section 42c. The electrode wiring 42 is bonded and electrically connected to the top surface of the electrode 36 at the connection section 42a. The wiring section 42b of the electrode wiring 42 is formed on a sloped surface of the insulation layer 40 that covers a portion of the side surface of the second columnar section P2, and connects the connection section 42a and the pad section 42c. The pad section 42c of the electrode wiring 42 is used as an electrode pad. The electrode wirings 41 and 42 can be formed from, for example, gold Au).

Overall Structure

In the optical semiconductor element 10 in accordance with the present embodiment, the n-type first mirror 21 and the p-type second mirror 23 of the surface-emitting type semiconductor laser 20, and the n-type first contact layer 31 and the p-type second contact layer 33 of the electrostatic breakdown protection element 30 form an npnp structure as a whole. The electrostatic breakdown protection element 30 is provided to prevent electrostatic destruction of the surface-emitting type semiconductor laser 20, and absorb a part of laser light generated in the surface-emitting type semiconductor laser 20.

More specifically, in the optical semiconductor element 10 in accordance with the present embodiment, the electrode 26 of the surface-emitting type semiconductor laser 20 and the electrode 35 of the electrostatic breakdown protection element 30 are electrically connected to each other by the electrode wiring 41, and the electrode 27 of the surface-emitting type semiconductor laser 20 and the electrode 36 of the electrostatic breakdown protection element 30 are electrically connected to each other by the electrode wiring 42. It is noted that the electrode 26 of the surface-emitting type semiconductor laser 20 is a p-electrode that is formed on the contact layer 24 composed of p-type GaAs, and the electrode 27 is an n-electrode formed on the n-type first mirror 21. On the other hand, the electrode 35 of the electrostatic breakdown protection element 30 is an n-electrode formed on the first contact layer 31 composed of the n-type GaAs layer, and the electrode 36 is a p-electrode formed on the second contact layer 33 composed of the p-type GaAs layer. Accordingly, the electrostatic breakdown protection element 30 is connected in parallel with the surface-emitting type semiconductor laser 20 by the electrode wirings 41 and 42 so as to have a reverse polarity (a reverse rectification) with respect to the surface-emitting type semiconductor laser 20.

Figure 3:
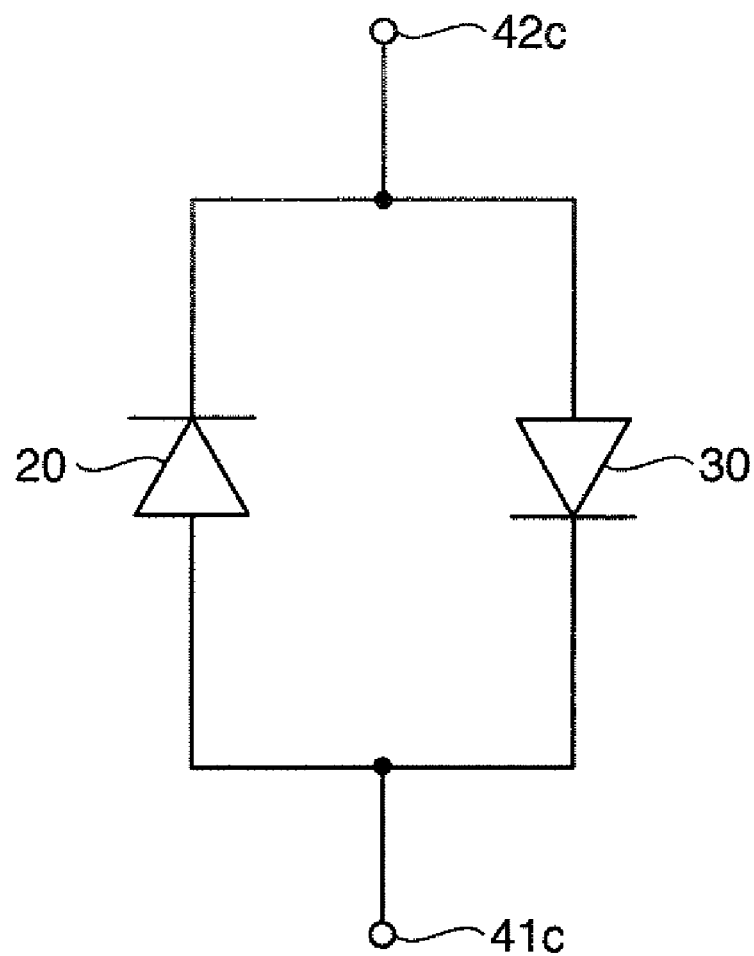
FIG. 3 is an equivalent circuit of the optical semiconductor element in accordance with the first embodiment of the invention.

FIG. 3 shows an equivalent circuit diagram of the optical semiconductor element 10 in accordance with the first embodiment. The surface-emitting type semiconductor laser 20 has, as shown in FIG. 3, an anode electrode (positive electrode) connected to the pad section 41c of the electrode wiring 41, and a cathode electrode (negative electrode) connected to the pad section 42c of the electrode wiring 42. Further, the electrostatic breakdown protection element 30 has an anode electrode (positive electrode) connected to the pad section 42c of the electrode wiring 42, and a cathode electrode (negative electrode) connected to the pad section 41c of the electrode wiring 41.

Operation of Optical Semiconductor Element

General operations of the optical semiconductor element 10 in accordance with the present embodiment are described below. It is noted that the following method for driving the optical semiconductor element 10 is described as an example, and various changes can be made within the scope of the invention. First, when the pad sections 41c and 42c are connected to a power supply (illustration omitted), and a voltage in a forward direction is applied across the electrode 26 and the electrode 27, recombination of electrons and holes occur in the active layer 22 of the surface-emitting type semiconductor laser 20, thereby causing emission of light due to the recombination. Stimulated emission occurs during the period the generated light reciprocates between the second mirror 23 and the first mirror 21, whereby the light intensity is amplified.

When the optical gain exceeds the optical loss, laser oscillation occurs, whereby laser light is emitted from the top surface of the second mirror 23, and enters the isolation layer 28. Then, the laser light enters the first contact layer 31 of the electrostatic breakdown protection element 30. Then, the light entered the first contact layer 31 composing the electrostatic breakdown protection element 30 then enters the electrostatic breakdown protection layer 32. A part of the incident light is absorbed by the electrostatic breakdown protection layer 32. On the other hand, the laser light that has not been absorbed by the electrostatic breakdown protection layer 32 is emitted outside through the second contact layer 33 from the emission surface 34. In this manner, in the optical semiconductor element 10 in accordance with the present embodiment, an eye-safe measure in which a portion of laser light emitted from the surface-emitting type semiconductor laser 20 is absorbed by the electrostatic breakdown protection element 30 is implemented.

Figure 4A:
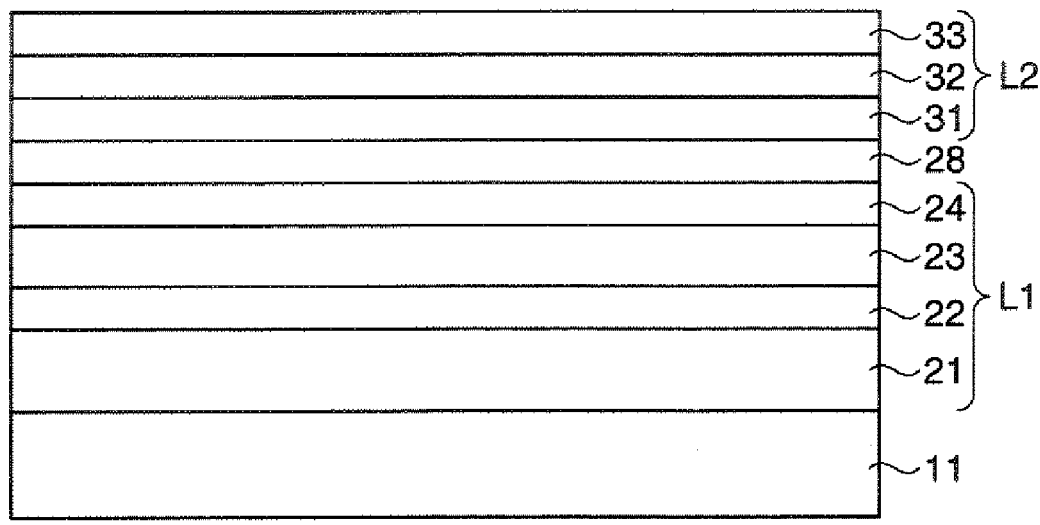
FIG. 4 is a cross-sectional view schematically showing a step of a method for manufacturing an optical semiconductor element in accordance with the first embodiment of the invention.

Also, a voltage in a reverse direction may be applied to the surface-emitting type semiconductor laser 20 across the electrode 26 and the electrode 27 by an external factor such as static electricity. In this case, the voltage in a reverse direction is a voltage in a reverse direction with respect to the surface-emitting type semiconductor laser 20, but is a voltage in a forward direction with respect to the electrostatic breakdown protection element 30. For this reason, even when a voltage in a reverse direction with respect to the surface-emitting type semiconductor laser 20 is applied, the current flows through the electrostatic breakdown protection element 30, and therefore the surface-emitting type semiconductor laser 20 can be protected from electrostatic destruction Method for Manufacturing Optical Semiconductor Element Next, a method for manufacturing the optical semiconductor element 10 described above is described. FIGS. 4 through 7 are cross-sectional views schematically showing the steps of the method for manufacturing the optical semiconductor element in accordance with the first embodiment of the invention. It is noted that these figures correspond to the cross-sectional view shown in FIG. 2. For manufacturing the optical semiconductor element 10 of the present embodiment, first, on a surface 11a of a semiconductor substrate 11 composed of an n-type GaAs layer, a semiconductor multilayer film is formed by epitaxial growth while modifying its composition, as shown in FIG. 4A.

The semiconductor multilayer film is formed from a first semiconductor multilayer film L1, an isolation layer 28 on the first semiconductor multilayer film L1, and a second semiconductor multilayer film L2 on the isolation layer 28. The first semiconductor multilayer film L1 is composed of, for example, a first mirror 21 of 40 pairs of alternately laminated n-type $Al_{0.9}Ga_{0.1}As$ layers and n-type $Al_{0.15}Ga_{0.85}As$ layers, an active layer 22 composed of GaAs well layers and $Al_{0.3}Ga_{0.7}As$ barrier layers in which the well layers include a quantum well structure composed of three layers, a second mirror 23 of 25 pairs of alternately laminated p-type $Al_{0.9}Ga_{0.1}As$ layers and p-type $Al_{0.15}Ga_{0.85}As$ layers, and a contact layer 24 composed of p-type GaAs.

The isolation layer 28 is composed of an AlGaAs layer in which no impurity is doped. The second semiconductor multilayer film L2 is composed of for examples a first contact layer 31 composed of an n-type GaAs layer, an electrostatic breakdown protection layer 32 composed of a GaAs layer in which no impurity is doped, and a second contact layer 33 composed of a p-type GaAs layer. These layers are sequentially laminated on the semiconductor substrate 11, thereby forming the semiconductor multilayer film. It is noted that the isolation layer 28 can be composed of a p-type or n-type AlGaAs layer.

It is noted that, when the second mirror 23 is grown, at least one layer thereof near the active layer 22 is formed to be a layer that is later oxidized and becomes a current constricting layer 25 (see FIG. 6A). More concretely, the layer that becomes to be the current constricting layer 25 is formed to be an AlGaAs layer (including an AlAs layer) having an Al composition that is greater than an Al composition of the isolation layer 28. In other words, the isolation layer 28 may preferably be formed to be an AlGaAs layer whose Al composition is smaller than that of the layer that becomes to be the current constricting layer 25. By this, in an oxidizing process for forming the current constricting layer 25 to be described below (see FIG. 6A), the isolation layer 28 is not oxidized. More specifically, the layer that becomes to be the current constricting layer 25 and the isolation layer 28 may preferably be formed such that the Al composition of the layer that becomes to be the current constricting layer 25 is 0.95 or greater, and the Al composition of the isolation layer 28 is less than 0.95. An optical film thickness of the isolation layer 28 may preferably be, for example, an odd multiple of $\lambda/4$, where $\lambda$ is a design wavelength of the surface-emitting type semiconductor laser 20 (see FIG. 2).

Also, the sum of optical film thickness of the first contact layer 31, the electrostatic breakdown protection layer 32 and the second contact layer 33, in other words, the total optical film thickness of the electrostatic breakdown protection element 30 (see FIG. 2) may preferably be, for example, an odd multiple of $\lambda/4$. As a result, the entire electrostatic breakdown protection element 30 can function as a distributed Bragg reflector. In other words, the entire electrostatic breakdown protection element 30 can function as a distributed Bragg reflector above the active layer 22 in the surface-emitting type semiconductor laser 20. Accordingly, the electrostatic breakdown protection element 30 can function as a distributed Bragg reflector without adversely affecting the characteristics of the surface-emitting type semiconductor laser 20. By this, a substantial reduction in the reflection coefficient of the electrostatic breakdown protection element 30 with respect to laser light and a substantial elevation in the transmittivity can be prevented.

The temperature at which the epitaxial growth is conducted is appropriately decided depending on the growth method, the kind of raw material, the type of the semiconductor substrate 11, and the kind, thickness and carrier density of the semiconductor multilayer film to be formed, and may preferably be set generally at 450° C.-800° C. Also, the time required for conducting the epitaxial growth is appropriately decided like the temperature. Also, a metal-organic vapor phase deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 4B:
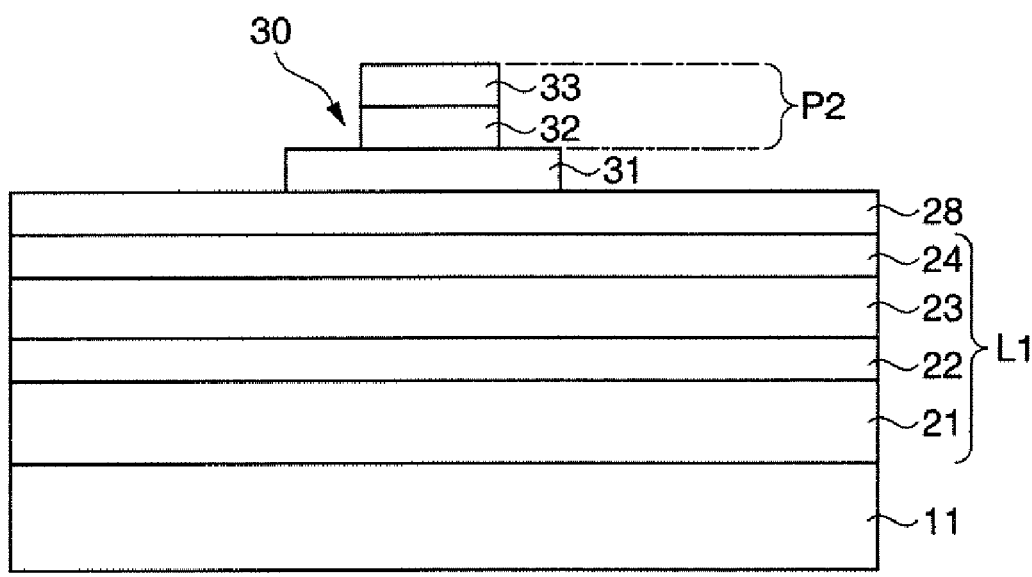

Next, a second columnar section P2 is formed by etching the second semiconductor multilayer film L2, as shown in FIG. 4B. To form the second columnar section P2, first, resist (not shown) is coated on the second semiconductor multilayer film L2, and then the resist is patterned by a lithography method. As a result, a resist layer having a specified plane configuration is formed on the top surface of the second contact layer 33. Then, by using the resist layer as a mask, the second contact layer 33 and the electrostatic breakdown protection element 32 are etched by, for example, a dry etching methods By this, the second contact layer 33 and the electrostatic breakdown protection layer 32 having the same plane configuration as that of the second contact layer 33 are formed. As a result, the second columnar section P2 is formed. When the second columnar section P2 is formed, the resist layer is removed.

When the second columnar section P2 is formed, the first contact layer 31 is patterned into a specified configuration. More concretely, first, resist (not shown) is coated on the first contact layer 31, and then the coated resist is patterned by a photolithography method. As a result, a resist layer having a specified pattern that covers the second columnar section P2 is formed on the first contact layer 31. Then, by using the resist layer as a mask, the first contact layer 31 is etched to a specified thickness by, for example, dry etching.

Then, the remaining portion of the first contact layer 31 is etched by a wet etching method. It is noted that, for etching the first contact layer 31, for example, a mixed solution of ammonia, hydrogen peroxide and water can be used as an etchant. In this case, the mixing ratio of ammonia, hydrogen peroxide and water which is about 1:10:150 can be used, but the mixing ratio is not particularly limited, and may be appropriately decided. It is noted that, because the isolation layer 28 is disposed below the first contact layer 31, and the isolation layer 28 functions as an etching stopper layer, etching of the first contact layer 31 can be accurately and readily stopped at the time when the isolation layer 28 is exposed.

By the steps described above, the electrostatic breakdown protection element 30 is formed, as shown in FIG. 4B. The electrostatic breakdown protection element 30 includes the second contact layer 33, the electrostatic breakdown protection layer 32 and the first contact layer 31. Moreover, the plane configuration of the first contact layer 31 is made to be greater than the plane configuration of the second contact layer 33 and the electrostatic breakdown protection layer 32. It is noted that, in the exemplary process described above, the second contact layer 33 and the electrostatic breakdown protection layer 32 are patterned, and then the first contact layer 31 is patterned. However, the first contact layer 31 may be patterned first, and then the second contact layer 33 and the electrostatic breakdown protection layer 32 may be patterned.

Figure 5A:
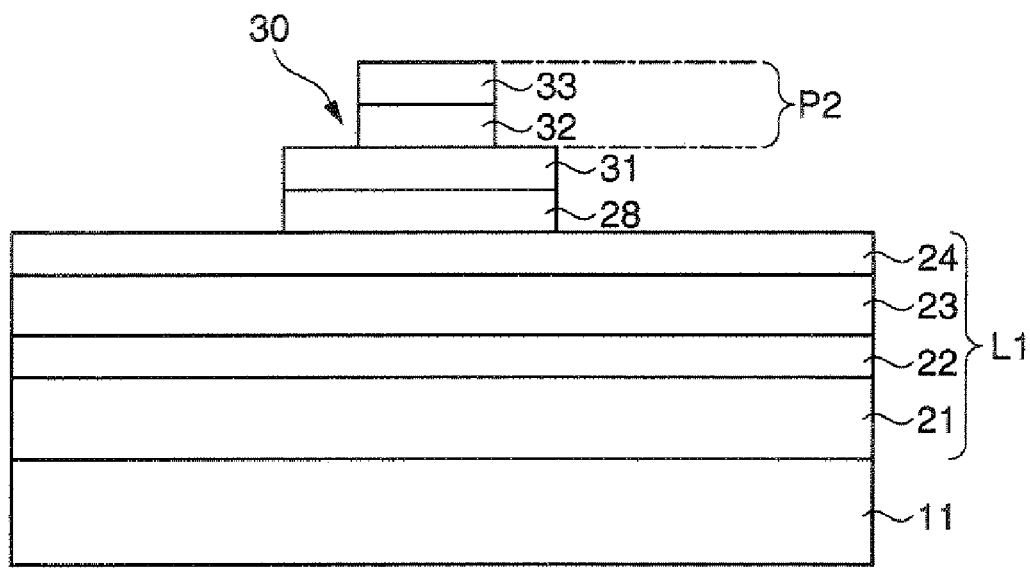
FIG. 5 is a cross-sectional view schematically showing a step of the method for manufacturing an optical semiconductor element in accordance with the first embodiment of the invention.

When the electrostatic breakdown protection element 30 is formed, the isolation layer 28 is patterned into a specified configuration, as shown in FIG. 5A. More specifically, by using the resist layer described above (the resist layer used for etching the first contact layer 31) as a mask, the isolation layer 28 is etched. In this instance, because the contact layer 24 is disposed below the isolation layer 28, and the contact layer 24 functions as an etching stopper layer, etching of the isolation layer 28 can be accurately and readily stopped at the time when the contact layer 24 is exposed. As an etchant for etching the isolation layer 28, for example, a hydrogen fluoride solution or a buffer solution of hydrofluoric acid can be used.

As a result, the isolation layer 28 that is patterned is formed, as shown in FIG. 5A. Then, the resist layer (the resist layer used for etching the first contact layer 31 and the isolation layer 28) is removed. In the illustrated example, the plane configuration of the isolation layer 28 is made to be the same as the plane configuration of the first contact layer 31. However, the plane configuration of the isolation layer 28 can be made to be greater than the plane configuration of the first contact layer 31. For example, another resist layer having a larger plane configuration area than that of the resist layer used for patterning the isolation layer 28 described above may be used to pattern the isolation layer 28.

Figure 5B:
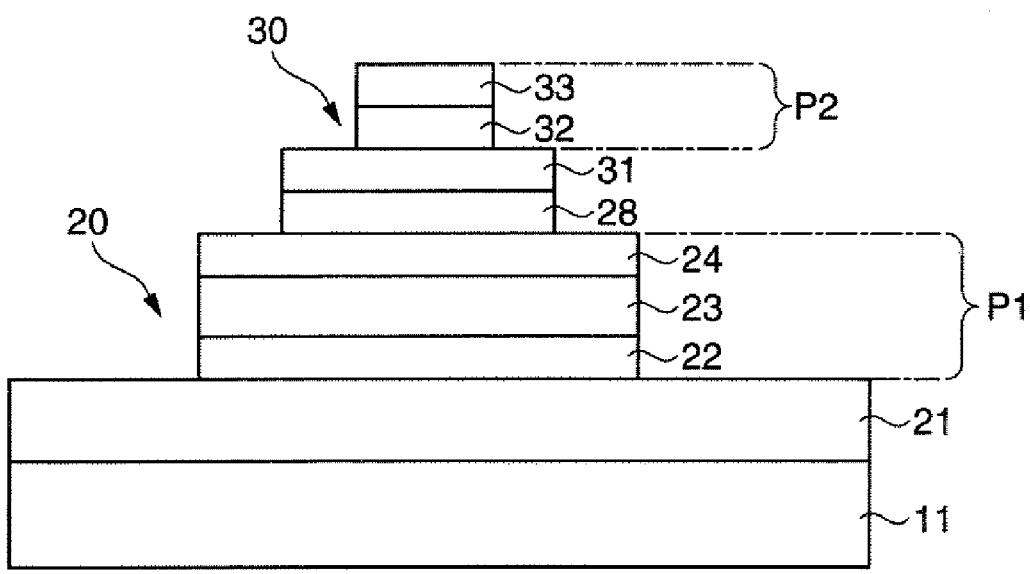

Next, as shown in FIG. 5B, the first semiconductor multilayer film L1 is etched, whereby a surface-emitting type semiconductor laser 20 including a first columnar section P1 is formed. More specifically, first, resist (not shown) is coated on the contact layer 24 of the first semiconductor multilayer film L1, and then the coated resist is patterned by a lithography method. As a result, a resist layer having a specified pattern is formed. Then, by using the resist layer as a mask, the contact layer 24, the second mirror 23 and the active layer 22 are etched by, for example, a dry etching method. As a result, the first columnar section P1 is formed, as shown in FIG. 5A.

By the steps described above, a vertical resonator (the surface-emitting type semiconductor laser 20) including the first columnar section P1 is formed on the semiconductor substrate 11. By this, a laminated body of the surface-emitting type semiconductor laser 20, the isolation layer 28 and the electrostatic breakdown protection element 30 is formed. Then, the resist layer is removed. It is noted that, in the exemplary embodiment described above, after forming the electrostatic breakdown protection element 30 and the isolation layer 28, the first columnar section P1 is formed. However, the first columnar section P1 may be formed first, and then the electrostatic breakdown protection element 30 and the isolation layer 28 may be formed.

Figure 6A:
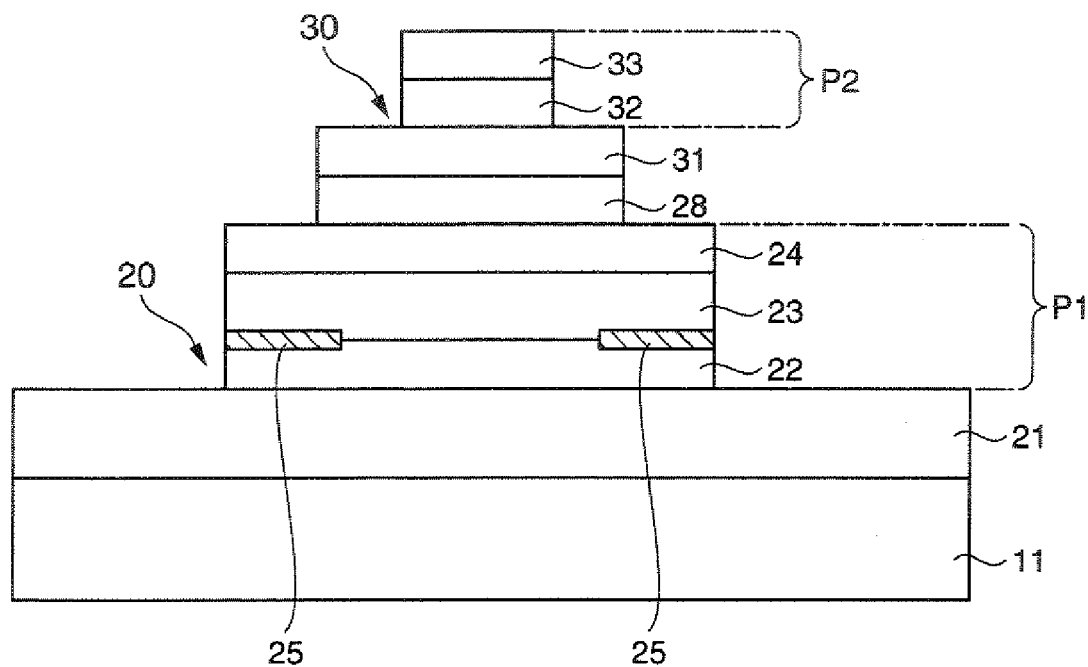
FIG. 6 is a cross-sectional view schematically showing a step of the method for manufacturing an optical semiconductor element in accordance with the first embodiment of the invention.

Then, as shown in FIG. 6A, a current constricting layer 25 is formed. To form the current constricting layer 25, the semiconductor substrate 11 on which the first columnar section P1 and the second columnar section P2 are formed is placed in a water vapor atmosphere at, for example, about 400° C. As a result, a layer having a high Al composition in the second mirror 23 described above is oxidized from its side surface, whereby the current constricting layer 25 is formed.

The oxidation rate is decided according to the temperature of the furnace, the amount of water vapor supply, and the Al composition and the film thickness of the layer to be oxidized. When driving a surface-emitting type laser equipped with the current constricting layer 25 that is formed by oxidation, current flows only in a portion where the current constricting layer 25 is not formed (a portion that is not oxidized). Accordingly, in the process of forming the current constricting layer 25, the range of the current constricting layer 25 to be formed may be controlled, whereby the current density can be controlled Also, the diameter of the current constricting layer 25 may preferably be adjusted such that a major portion of laser light that is emitted from the surface-emitting type semiconductor laser 20 enters the first contact layer 31.

Figure 6B:
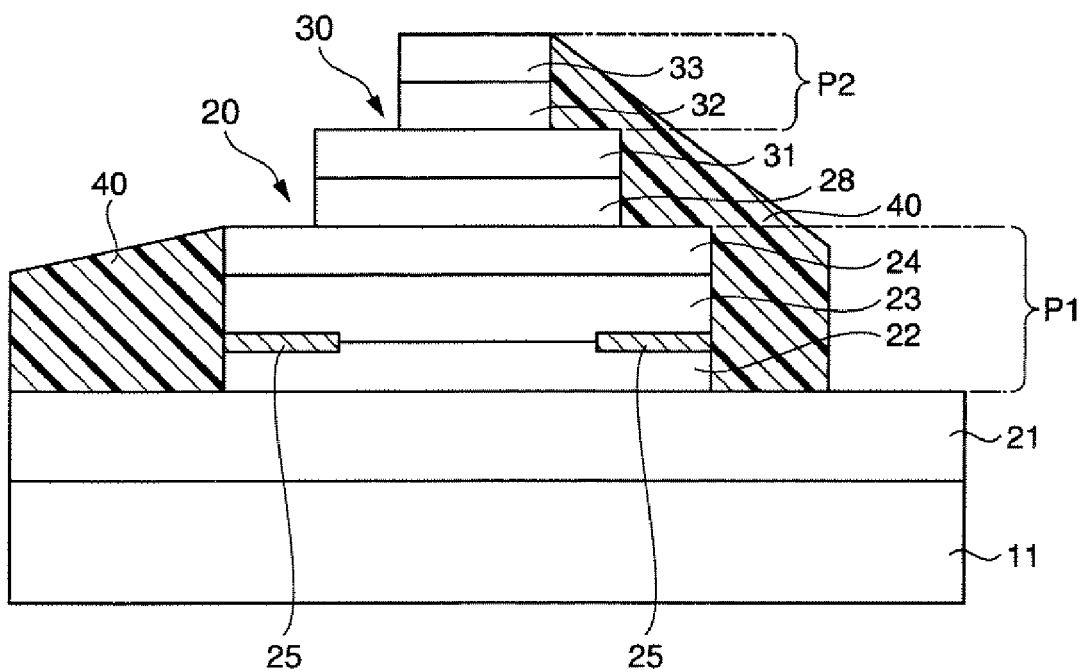

Next, as shown in FIG. 6B, an insulation layer 40 is formed on the first mirror 21, and around the first columnar section P1, on a part of the top surface of the first columnar section P1, on a part of the side surface of the isolation layer 28, on a part of the side surface and the top surface of the first contact layer 31, and on a part of the side surface of the second columnar section P2. The insulation layer 40 may preferably be composed of a material that is easier to make a thick film. The film thickness of the insulation layer 40 may be, for example, about 2-4 µm, but it is not particularly limited, and may be appropriately decided according to the height of the first columnar section P1 and the second columnar section P3.

For example, the insulation layer 40 can be formed from material that is obtained by hardening liquid material settable by energy such as, heat, light or the like (for example, a precursor of ultraviolet setting type resin or thermosetting type resin). As the ultraviolet setting type resin, for example, an acrylic resin, an epoxy resin or the like that is an ultraviolet setting type can be enumerated. Also, as the thermosetting type resin, a polyimide resin or the like that is a thermosetting type can be enumerated. Furthermore, for example, the insulation layer 40 may be composed of a laminated layered film using a plurality of the materials described above.

In this exemplary embodiment, the case where a precursor of polyimide resin is used as the material for forming the insulation layer 40 is described. First, for example, by using a spin coat method, the precursor (precursor of polyimide resin) is coated on the semiconductor substrate 11, thereby forming a precursor layer. In this instance, the precursor layer is formed in a manner to cover the top surface of the first columnar section P1. It is noted that, as the method for forming the precursor layer, besides the aforementioned spin coat method, other known techniques, such as, a dipping method, a spray coat method, an ink jet method or the like can be used. Then, the semiconductor substrate 11 is heated by using, for example, a hot plate or the like, thereby removing the solvent, and then is placed in a furnace at about 350° C. to thereby imidize the precursor layer, whereby a polyimide resin layer that is almost completely set is formed. Then, the polyimide resin layer is patterned by using a known lithography technique, thereby forming the insulation layer 40, as shown in FIG. 6B.

As the etching method used for patterning, a dry etching method or the like can be used. Dry etching can be conducted with, for example, oxygen or argon plasma. In the method for forming the insulation layer 40 described above as an example, a precursor layer of polyimide resin is hardened and then patterning is conducted. However, before hardening the precursor layer of polyimide resin, patterning may be conducted. As the etching method used for this patterning, a wet etching method or the like may be used. The wet etching may be conducted with, for example, an alkaline solution or an organic solution.

Figure 7:
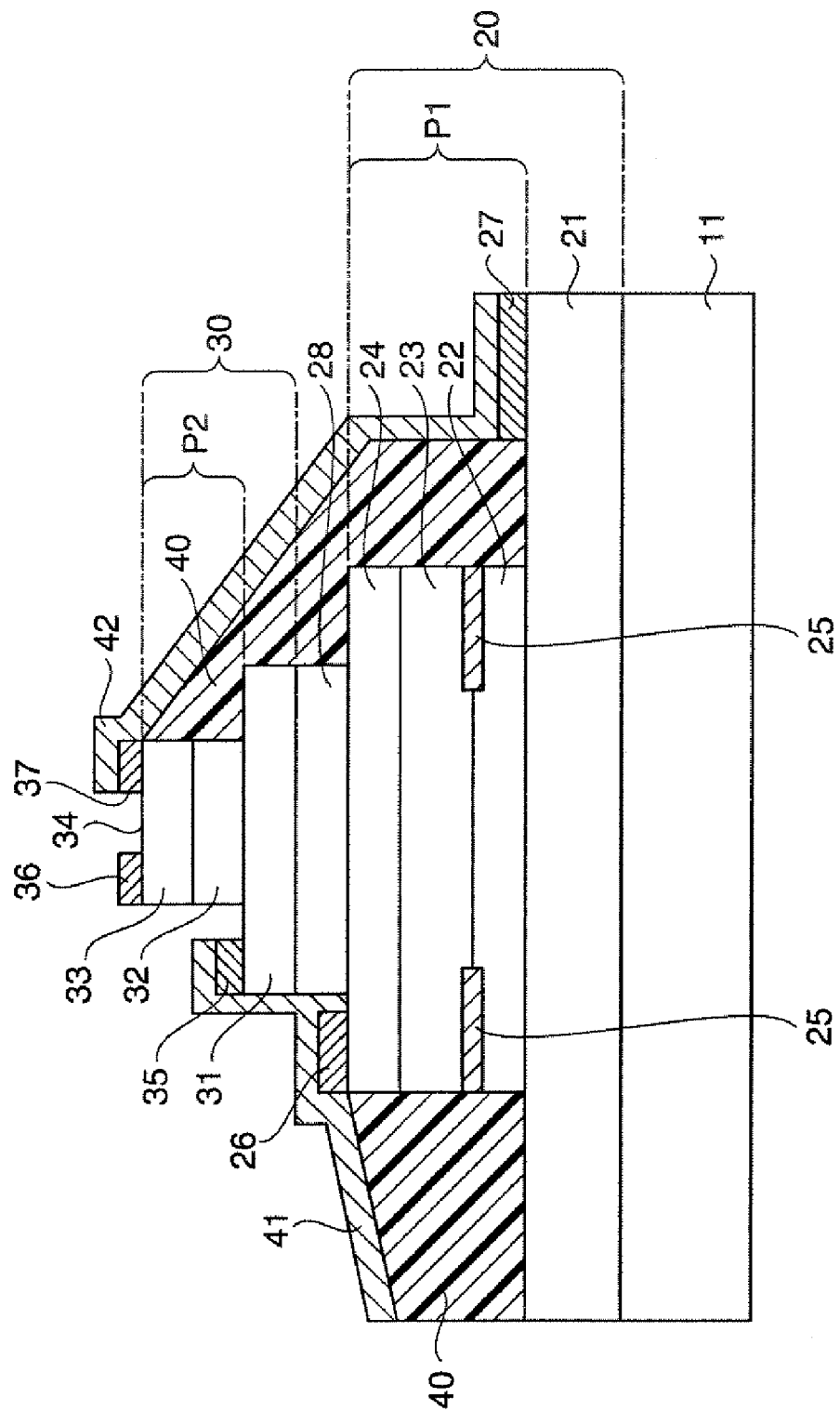
FIG. 7 is a cross-sectional view schematically showing a step of the method for manufacturing an optical semiconductor element in accordance with the first embodiment of the invention.

When the steps described above are completed, an electrode 27 on the first mirror 21, and an electrode 35 on the top surface of the first contact layer 31 are formed, as shown in FIG. 7. Further, an electrode 26 on the contact layer 24 and an electrode 36 on the second contact layer 33 are formed. For example, a method for forming the electrodes 27 and 35 may be conducted as follows. First, before forming the electrodes 27 and 35, the top surface of the first mirror 21 and the top surface of the first contact layer 31 are washed by a plasma processing method or the like, if necessary. As a result, an element with more stable characteristics can be formed. Next, a laminated layered film of, for example, an alloy of chrome (Cr), gold (Au) and germanium (Ge), nickel (Ni) and gold (Au) is formed by, for example, a vacuum deposition method. Then, the electrodes 27 and 35 are formed by removing portions of the laminated layered film other than specified positions by a lift-off method.

Further, for example, a method for forming the electrodes 26 and 36 may be conducted as follows. First, before forming the electrodes 26 and 36, the top surface of the contact layer 24 and the top surface of the second contact layer 33 are washed by a plasma processing method or the like, if necessary. As a result, an element with more stable characteristics can be formed. Next, a laminated layered film of, for example, an alloy of chrome (Cr), gold (Au) and zinc (Zn), and gold (Au) is formed by, for example, a vacuum deposition method. Then, the electrodes 26 and 36 are formed by removing portions of the laminated layered film other than specified positions by a lift-off method It is noted that in the process of forming the electrodes 27 and 35 and electrodes 26 and 36 described above, a dry etching method or a wet etching method may be used instead of a lift-off method Also, in the above-described process, a sputter method may be used instead of a vacuum deposition method. Moreover, although the electrodes 27 and 36 are concurrently patterned, and the electrodes 26 and 36 are concurrently patterned in the process described above, these electrodes may be formed individually from one another.

When the process described above is completed, electrode wirings 41 and 42 are formed, as shown in FIG. 7. It is noted that the electrode wiring 41 is formed in a manner to electrically connect the electrode 26 of the surface-emitting type semiconductor laser 20 with the electrode 35 of the electrostatic breakdown protection element 30. Further, the electrode wiring 42 is formed in a manner to electrically connect the electrode 27 of the surface-emitting type semiconductor laser 20 with the electrode 36 of the electrostatic breakdown protection element 30. Concretely, just like the aforementioned case of forming the electrodes, surfaces above the semiconductor substrate 11 are washed by using a plasma processing method or the like according to the necessity. Next, a metal film composed of, for example, gold (Au) is formed by, for example, a vacuum deposition method. Then, portions of the metal film other than the specified positions are removed, thereby forming the electrode wirings 41 and 42.

Finally, an annealing treatment is conducted. The temperature of the annealing treatment depends on the electrode material. For example, the annealing treatment may be conducted at about 400° C. in the case of the electrode material used in the present embodiment. It is noted that the annealing treatment may be conducted before the electrode wirings 41 and 42 are formed, if necessary. By the process described above, the optical semiconductor element 10 shown in FIG; 1 and FIG. 2 is manufactured.

Second Embodiment

Figure 8:
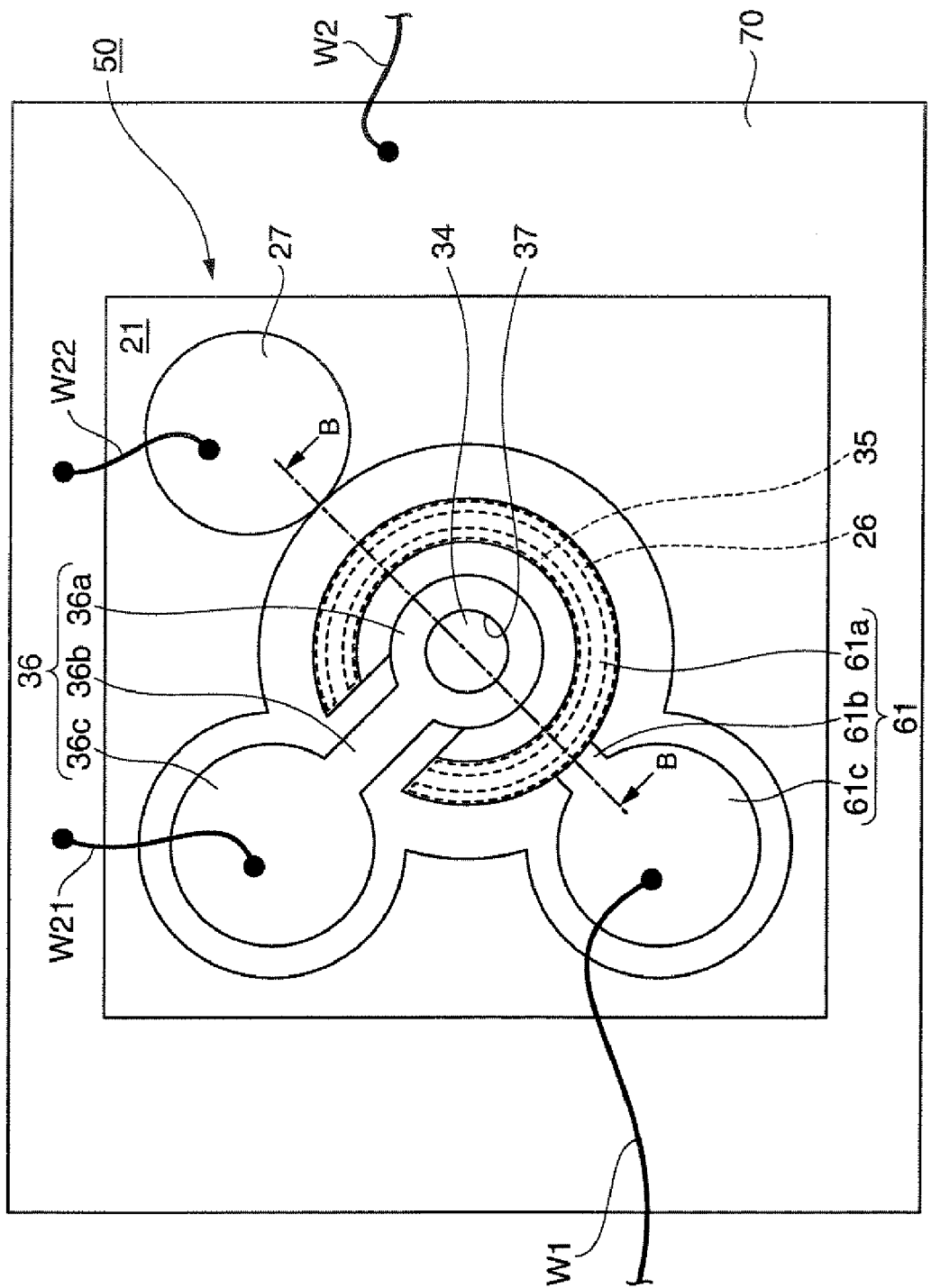
FIG. 8 is a plan view schematically showing an optical semiconductor element in accordance with a second embodiment of the invention.
Figure 9:
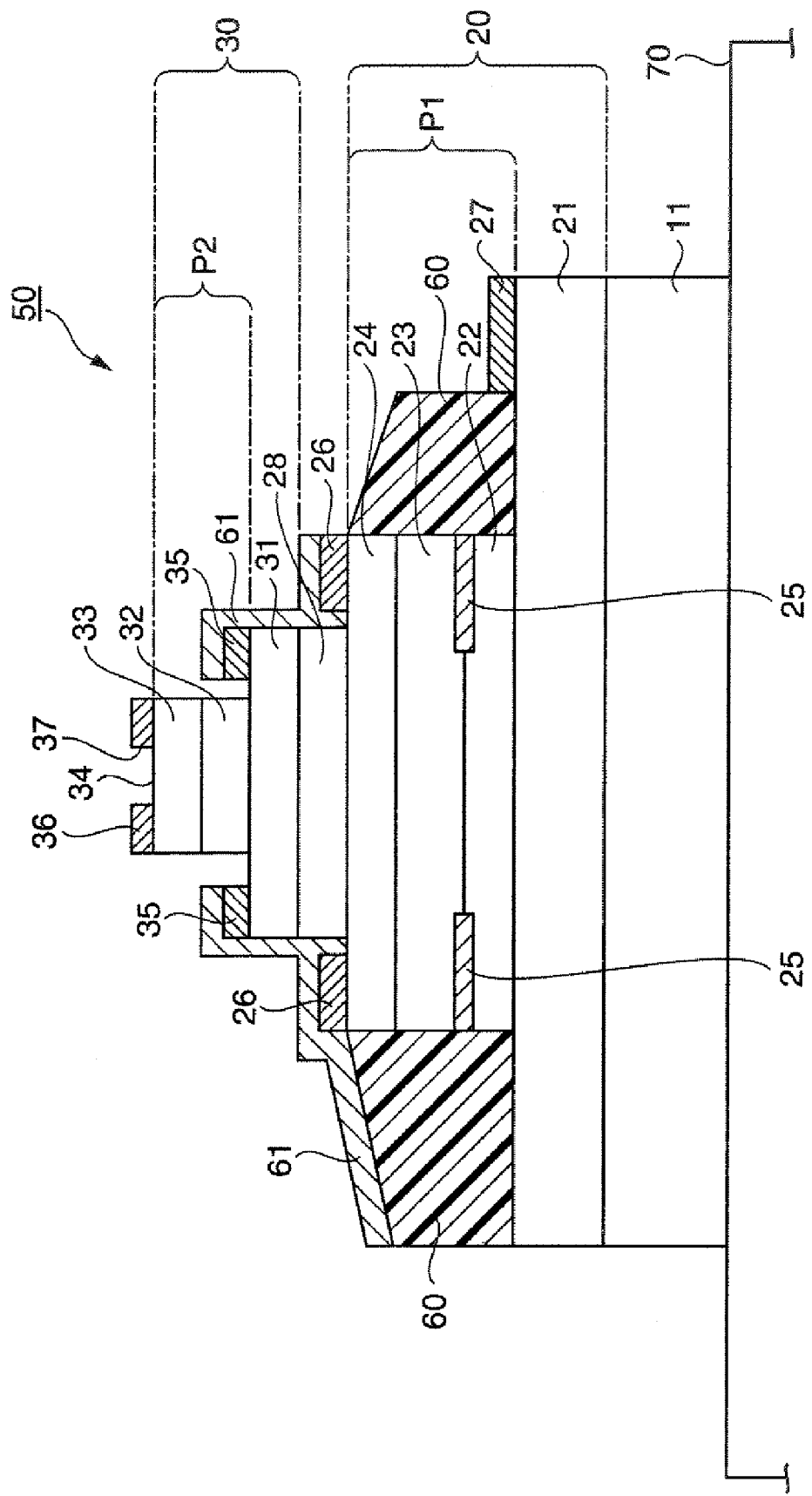
FIG. 9 is a cross-sectional view taken along a line B-B of FIG. 8.

FIG. 8 is a plan view schematically showing an optical semiconductor element in accordance with a second embodiment of the invention, and FIG. 9 is a cross-sectional view taken along a line B-B of FIG. 8. It is noted that, in the following description and in FIG. 8 and FIG. 9, components of the second embodiment similar to the components described in the first embodiment shown in FIG. 1 and FIG. 2 are appended with the same reference numerals. As shown in FIGS. 8 and 9, the optical semiconductor element 50 in accordance with the second embodiment includes a surface-emitting type semiconductor laser 20 and an electrostatic breakdown protection element 30 provided over a substrate 11. The surface-emitting type semiconductor laser 20 and the electrostatic breakdown protection element 30 of the optical semiconductor element 50 of the second embodiment have generally the same structure as that of the optical semiconductor element 10 in accordance with the first embodiment shown in FIGS. 1 and 2.

Concretely, the surface-emitting type semiconductor laser 20 has a multilayered structure in which, for example, a distributed Bragg reflector (first mirror) 21 of 40 pairs of alternately laminated n-type $Al_{0.9}Ga_{0.1}As$ layers and n-type $Al_{0.15}Ga_{0.85}As$ layers, an active layer 22 composed of GaAs well layers and $Al_{0.3}Ga_{0.7}As$ barrier layers in which the well layers include a quantum well structure composed of three layers, a distributed Bragg reflector (second mirror) 23 of 25 pairs of alternately laminated p-type $Al_{0.9}Ga_{0.1}As$ layers and p-type $Al_{0.15}Ga_{0.8}As$ layers, and a contact layer 24 composed of p-type GaAs are successively laminated.

The electrostatic breakdown protection element 30 has a multilayered structure in which a first contact layer 31 composed of, for example, an n-type GaAs layer, an electrostatic breakdown protection layer 32 composed of a GaAs layer in which no impurity is doped, and a second contact layer 33 composed of a p-type GaAs layer are successively laminated. It is noted that, in the electrostatic breakdown protection element 30 in accordance with the present embodiment, its entire optical film thickness may also preferably be set at a film thickness other than a multiple of $\lambda/2$ at which the resonance condition is established. More concretely, the total optical film thickness of the electrostatic breakdown protection element 30 may preferably be set at an odd multiple of $\lambda/4$. It is noted that an isolation layer 28 composed of, for example, an AlGaAs layer in which no impurity is doped is provided between the surface-emitting type semiconductor laser 20 and the electrostatic breakdown protection element 30.

Furthermore, an electrode 26 having a plane configuration in a ring shape is provided on the contact layer 24 of the surface-emitting type semiconductor laser 20 along the outer circumference of the first columnar section P1. The electrode 26 is formed from a multilayer film oft for example, an alloy of chrome (Cr), gold (Au) and zinc (Zn), and gold (Au), or a multilayer film of, for example, platinum (Pt), titanium (Ti) and gold (Au). Also, an electrode 27 is formed on a portion of the top surface of the second mirror 21. The electrode 27 is formed from a multilayer film of, for example, an alloy of chrome (Cr), gold (Au) and germanium (Ge), nickel (Ni), and gold (Au). The electrodes 26 and 27 are provided for driving the surface-emitting type semiconductor laser 20, and a current is injected into the active layer 22 through the electrodes 26 and 27. It is noted that the electrodes 26 and 27 provided in the surface-emitting type semiconductor laser 20 in accordance with the present embodiment are different in their plane configuration from those provided in the first embodiment shown in FIG. 8.

An electrode 35 having a ring-shaped plane configuration is formed on the first contact layer 31 of the electrostatic breakdown protection element 30 along an outer circumference thereof. In other words, the electrode 35 is provided in a manner to surround the second columnar section P2 except a portion thereof The electrode 35 may be formed from the same material as that of the electrode 27 formed on the first mirror 21 of the surface-emitting type semiconductor laser 20. Also, an electrode 36 is formed on the top surface of the electrostatic breakdown protection element 30 (on the second contact layer 33). The electrode 36 defines an opening section 37, and a portion of the surface exposed through the opening section 37 is a laser light emission surface 34. The electrode 36 may be formed from the same material as that of the electrode 26 formed on the contact layer 24 of the surface-emitting type semiconductor laser 20. It is noted that the electrodes 35 and 36 provided on the electrostatic breakdown protection element 30 of the present embodiment are different in their plane configuration from those provided on the first embodiment, as shown in FIG. 8.

The optical semiconductor element 50 in accordance with the present embodiment is provided with an insulation layer 60 formed mainly around the circumference of the first columnar section P1 on the first mirror 21, as shown in FIG. 8 and FIG. 9. Also, as shown in FIG. 8, the insulation layer 60 is provided below the electrode 36 and an electrode wiring 61 to be described below. Also, as shown in FIG. 8, an electrode wiring 61 that electrically connects the electrode 26 of the surface-emitting type semiconductor laser 20 with the electrode 35 of the electrostatic breakdown protection element 30 is formed in a manner to surround the second columnar section P2. The electrode wiring 61 has a connection section 61a having a ring-shaped plane configuration, a wiring section 61b, and a pad section 61c having a circular plane configuration. The electrode wiring 61 is bonded and electrically connected to the top surfaces of the electrodes 26 and 35 at the connection section 61a. The wiring section 61b of the electrode wiring 61 connects to the connection section 61a and the pad section 61c. The pad section 61c of the electrode wiring 61 is used as an electrode pad.

Also, as shown in FIG. 8, the electrode 36 in accordance with the present embodiment has a connection section 36a having a ring-shaped plane configuration, a wiring section 36b, and a pad section 36c having a circular plane configuration. The electrode 36 is bonded to the top surface of the second contact layer 33 of the electrostatic breakdown protection element 30 at the connection section 36a. The wiring section 36b of the electrode wiring 36 is formed on the insulation layer 60 and connects to the connection section 36a and the pad section 36c. The pad section 36c of the electrode wiring 36 is formed on the insulation layer 60, and is used as an electrode pad.

The optical semiconductor element 50 described above is slightly different in its plane structure from the optical semiconductor element 10 shown in FIG. 1 and FIG. 2, but its basic structure is generally the same as that of the optical semiconductor element 10, and therefore is manufactured by a manufacturing process similar to the manufacturing process applied to the optical semiconductor element 10. It is noted that the optical semiconductor element 10 in accordance with the first embodiment described above is provided with the electrode wiring 42 that connects the electrode 27 of the surface-emitting type semiconductor laser 20 with the electrode 36 of the electrostatic breakdown protection element 30, but the optical semiconductor element 30 in accordance with the present embodiment is not provided with such a member corresponding to the electrode wiring 42. Therefore, in the process for manufacturing the optical semiconductor element 50, the step of forming the electrode wiring 42 is omitted.

The optical semiconductor element 50 described above is mounted on an optical subassembly (OSA) such as a transmitter optical subassembly (TOSA). Therefore, when the optical semiconductor element 50 is mounted on an OSA, the optical semiconductor element 50 is mounted on a submount 70 to be provided on the OSA (see FIG. 8 and FIG. 9). When the optical semiconductor element 50 is mounted on the submount 70, wire-bonding is conducted with metal wires such as gold wires for connecting the electrodes 26 and 27 of the surface-emitting type semiconductor laser 20 and the electrodes 35 and 36 of the electrostatic breakdown protection element 30 to lead wires (not shown) provided on the OSA.

It is noted that, as shown in FIG. 8, one end of a metal wire W1 is bonded to the pad section 61c of the electrode wiring 61, and the other end of the metal wire W1 is bonded to one of the lead wires provided on the OSA. By this, one of the lead wires provided on the OSA is electrically connected to the electrode 26 of the surface-emitting type semiconductor laser 20 and the electrode 35 of the electrostatic breakdown protection element 30.

Furthermore, the pad section 36c of the electrode 36 is bonded to one end of a metal wire W21 having the other end bonded to the submount 70, and the electrode 27 is bonded to one end of a metal wire W22 having the other end bonded to the submount 70. Moreover, one end of a metal wire W2 is bonded to the submount 70, and the other end of the metal wire W2 is bonded to another lead wire provided on the OSA. By connecting the pad section 36c of the electrode 36 and the electrode 27 to the submount 70 with the metal wires W21 and W22, the electrode 36 and the electrode 27 are electrically connected to each other. Furthermore, by connecting the submount 70 to the lead wire provided on the OSA with the metal wire W2, one of the lead wires provided on the OSA, the electrode 27 of the surface-emitting type semiconductor laser 20 and the electrode 36 of the electrostatic breakdown protection element 30 are electrically connected to one another.

By making the connections with the metal wires described above, the electrostatic breakdown protection element 30 is connected in parallel with the surface-emitting type semiconductor laser 20 in a manner to have a reverse polarity (i.e., a reverse rectification) with respect to the surface-emitting type semiconductor laser 20. As a result, the optical semiconductor element 50 in accordance with the present embodiment can have a circuit similar to the equivalent circuit shown in FIG. 3. It is noted that, in the example described with reference to FIG. 8, the pad section 36c of the electrode 36 and the electrode 27 are connected to the submount 70 with the metal wires W21 and W22, and the submount 70 is connected to the lead wire provided on the OSA with the metal wire W2. However, if the lead wire is sufficiently close to the pad section 36c of the electrode 36 and the electrode 27, the pad section 36c of the electrode 36 and the electrode 27 can be directly connected to the lead wire.

The first embodiment and the second embodiment of the invention are described above. In both of the embodiments, the electrostatic breakdown protection element 30 is provided on an optical path of laser light emitted from the surface-emitting type semiconductor laser 20, and the electrostatic breakdown protection element 30 protects the surface-emitting type semiconductor laser 20 from electrostatic destruction, whereby the electrostatic breakdown voltage of the surface-emitting type semiconductor laser 20 can be improved. Also, the electrostatic breakdown protection element 30 absorbs a portion of laser light emitted from the surface-emitting type semiconductor laser 20. For this reason, the output of laser light can be readily adjusted.

In this manner, in the first embodiment and the second embodiment, the electrostatic breakdown protection element 30 absorbs laser light to thereby implement an eye-safe measure. A conventional eye-safe measure is implemented through forming a reflective film at a laser beam emission window provided on an OSA such as a TOSA. However, in accordance with the first embodiment and the second embodiment described above, a similar eye-safe effect is achieved by the electrostatic breakdown protection element 30, such that an independent eye-safe measure (fabrication of a reflective film) on an OSA may be omitted. Moreover, when a reflective film is formed on a laser beam emission window provided on an OSA, there is a possibility that the laser beam may be reflected on the reflective film and may enter the surface-emitting type semiconductor laser 20 thereby generating noise. However, because such a reflective film can be omitted in accordance with the embodiments of the invention, noise can be reduced.

Also, the optical semiconductor device 10 of the first embodiment and the optical semiconductor device 50 of the second embodiment both have a structure in which the electrostatic breakdown protection element 30 is provided above the surface-emitting type semiconductor laser 20. Therefore, although the surface-emitting type semiconductor laser 20 and the electrostatic breakdown protection element 30 are provided in a single chip, its design margin does not become narrow, and miniaturization can be readily achieved.

The embodiments of the invention are described above, but the invention is not limited to the embodiments described above, and a variety of changes can be freely made within the scope of the invention For example, in the embodiments described above, the electrostatic breakdown protection element 30 provided above the surface-emitting type semiconductor laser 20 is described as a pin diode as an example composed of the first contact layer 31, the electrostatic breakdown protection layer 32 and the second contact layer 33. However, an electrostatic breakdown protection element can be formed with an element that forms a PN junction, a heterojunction, or a Schottky junction, in addition to an element that forms a PIN junction. When the electrostatic breakdown protection element 30 is an element formed with a Schottky junction, the metal layer forming a Schottky junction may preferably be formed thinly to the extent that laser light emitted from the surface-emitting type semiconductor laser 20 can transmit the metal layer, or an aperture for passing laser light may preferably be formed in the metal layer in a portion thereof on an optical path of the laser light. Furthermore, in the embodiments described above, interchanging the p-type and n-type characteristics in each of the layers does not deviate from the scope of the invention.

What is claimed is:

1. An optical semiconductor element comprising:
 a surface-emitting type semiconductor laser that emits laser light;
 an electrostatic breakdown protection element that is provided on an optical path of the laser light emitted from the surface-emitting type semiconductor laser, absorbs a portion of the laser light, and protects the surface-emitting type semiconductor laser from electrostatic destruction;
 a first electrode of a first polarity and a second electrode of a second polarity different from the first polarity, formed on the surface-emitting type semiconductor laser;
 a third electrode of the first polarity and a fourth electrode of the second polarity, formed on the electrostatic breakdown protection element; and
 a connection wiring formed on the second electrode and the third electrode for connecting the second electrode and the third electrode.

2. An optical semiconductor element according to claim 1, wherein the surface-emitting type semiconductor laser is provided on a substrate, and the electrostatic breakdown protection element is provided above the surface-emitting type semiconductor laser.

3. An optical semiconductor element according to claim 1, comprising an isolation layer between the surface-emitting type semiconductor laser and the electrostatic breakdown protection element for isolating the surface-emitting type semiconductor laser from the electrostatic breakdown protection element.

4. An optical semiconductor element according to claim 1, comprising a first electrode and a second electrode for driving the surface-emitting type semiconductor laser, wherein the electrostatic breakdown protection element is electrically connected between the first electrode and the second electrode in parallel with the surface-emitting type semiconductor laser, and has a reverse rectification direction with respect to the surface-emitting type semiconductor laser.

5. An optical semiconductor element according to claim 1, comprising a connection wiring formed on the first electrode and the fourth electrode for connecting the first electrode and the fourth electrode.

6. An optical semiconductor element according to claim 1, comprising a metal wire connected to each of the first electrode and the fourth electrode for electrically connecting the first electrode and the fourth electrode.

7. An optical semiconductor element according to claim 1, wherein the electrostatic breakdown protection element is an element formed with one of a PN junction, a PIN junction, a hetero junction, and a Schottky junction.

8. An optical semiconductor element comprising:
 a surface-emitting type semiconductor laser that emits laser light; and
 an electrostatic breakdown protection element that is provided on an optical path of the laser light emitted from the surface-emitting type semiconductor laser, absorbs a portion of the laser light, and protects the surface-emitting type semiconductor laser from electrostatic destruction,
 wherein the electrostatic breakdown protection element includes a first semiconductor layer of a first conductivity type, a second semiconductor layer that functions as a photoabsorption layer and an electrostatic breakdown protection layer, and a third semiconductor layer of a second conductivity type, and a total optical film thickness of the electrostatic breakdown protection element is a film thickness other than a film thickness that establishes a resonance condition of the laser light within the electrostatic breakdown protection element.

9. An optical semiconductor element according to claim 8, wherein the total optical film thickness of the electrostatic breakdown protection element equals to an odd multiple of one fourth of a wavelength of the laser light in the electrostatic breakdown protection element.

10. An optical semiconductor element according to claim 8, wherein the surface-emitting type semiconductor laser is provided on a substrate, and the electrostatic breakdown protection element is provided above the surface-emitting type semiconductor laser.

11. An optical semiconductor element according to claim 8, comprising an isolation layer between the surface-emitting type semiconductor laser and the electrostatic breakdown protection element for isolating the surface-emitting type semiconductor laser from the electrostatic breakdown protection element.

12. An optical semiconductor element according to claim 8, comprising a first electrode and a second electrode for driving the surface-emitting type semiconductor laser, wherein the electrostatic breakdown protection element is electrically connected between the first electrode and the second electrode in parallel with the surface-emitting type semiconductor laser, and has a reverse rectification direction with respect to the surface-emitting type semiconductor laser.

13. An optical semiconductor element according to claim 8, wherein the electrostatic breakdown protection element is an element formed with one of a PN junction, a PIN junction, a hetero junction, and a Schottky junction.

* * * * *

UNITED STATES PATENT AND TRADEMARK OFFICE
CERTIFICATE OF CORRECTION

PATENT NO. : 7,453,915 B2
APPLICATION NO. : 11/566850
DATED : November 18, 2008
INVENTOR(S) : Yasutaka Imai It is certified that error appears in the above-identified patent and that said Letters Patent is hereby corrected as shown below:

| | |
|---|---|
| Title Page | Foreign Patent Documents:<br>"JP 2006-033106 2/2006" should be --JP 2005-033106 2/2005-- |
| Column 6, Line 25: | "drawings" should be --drawings.-- |
| Column 6, Line 28: | "invention" should be --invention.-- |
| Column 7, Line 28: | "23" should be --23.-- |
| Column 8, Line 62 | "small," should be --small-- |
| Column 10, Line 34 | "Au)." should be --(Au).-- |
| Column 12, Line 25 | "of for examples" should be --of, for example,-- |
| Column 13, Line 29 | "methods" should be --method.-- |
| Column 16, Line 22 | "method" should be --method.-- |
| Column 16, Line 26 | "method" should be --method.-- |
| Column 16, Line 57 | "FIG;" should be --FIG.-- |
| Column 17, Line 22 | "$Al_{0.15}Ga_{0.8}As$" should be --$Al_{0.15}Ga_{0.85}As$-- |

UNITED STATES PATENT AND TRADEMARK OFFICE
CERTIFICATE OF CORRECTION

PATENT NO. : 7,453,915 B2
APPLICATION NO. : 11/566850
DATED : November 18, 2008
INVENTOR(S) : Yasutaka Imai It is certified that error appears in the above-identified patent and that said Letters Patent is hereby corrected as shown below:

Column 17, Line 46    "oft" should be --of,--

Column 17, Line 66    "thereof" should be --thereof.--

Column 20, Line 26    "invention" should be --invention.--

Signed and Sealed this

Ninth Day of June, 2009

JOHN DOLL
*Acting Director of the United States Patent and Trademark Office*